United States Patent
Tsao et al.

(10) Patent No.: US 11,127,704 B2
(45) Date of Patent: Sep. 21, 2021

(54) SEMICONDUCTOR DEVICE WITH BUMP STRUCTURE AND METHOD OF MAKING SEMICONDUCTOR DEVICE

(71) Applicant: TAIWAN SEMICONDUCTOR MANUFACTURING CO., LTD., Hsinchu (TW)

(72) Inventors: Pei-Haw Tsao, Tai-Chung (TW); Chen-Shien Chen, Zhubei (TW); Cheng-Hung Tsai, Tainan (TW); Kuo-Chin Chang, Chiayi (TW); Li-Huan Chu, Hsin Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/169,753

(22) Filed: Oct. 24, 2018

(65) Prior Publication Data
US 2019/0164920 A1 May 30, 2019

Related U.S. Application Data

(60) Provisional application No. 62/591,534, filed on Nov. 28, 2017.

(51) Int. Cl.
*H01L 23/00* (2006.01)

(52) U.S. Cl.
CPC ............. *H01L 24/13* (2013.01); *H01L 24/11* (2013.01); *H01L 24/16* (2013.01); *H01L 24/03* (2013.01); *H01L 24/05* (2013.01); *H01L 2224/0401* (2013.01); *H01L 2224/05124* (2013.01); *H01L 2224/05144* (2013.01); *H01L 2224/05147* (2013.01); *H01L 2224/05155* (2013.01); *H01L 2224/05166* (2013.01); *H01L 2224/05184* (2013.01); *H01L 2224/1147* (2013.01); *H01L 2224/13083* (2013.01); *H01L 2224/13111* (2013.01); *H01L 2224/13116* (2013.01);
(Continued)

(58) Field of Classification Search
CPC ......... H01L 24/13; H01L 24/11; H01L 24/16; H01L 21/268
See application file for complete search history.

(56) References Cited

U.S. PATENT DOCUMENTS 8,232,193 B2 7/2012 Chang
8,258,055 B2 9/2012 Hwang et al.
(Continued)

FOREIGN PATENT DOCUMENTS

JP 2015-226046 A 12/2015
KR 10-2009-0117380 11/2009
(Continued)

*Primary Examiner* — Dale E Page
*Assistant Examiner* — Wilner Jean Baptiste
(74) *Attorney, Agent, or Firm* — McDermott Will & Emery LLP

(57) ABSTRACT

A semiconductor device includes a substrate and at least one bump structure disposed over the substrate. The at least one bump structure includes a pillar formed of a metal having a lower solderability than copper or a copper alloy to a solder alloy disposed over the substrate. A solder alloy is formed directly over and in contact with an upper surface of the metal having the lower solderability than copper or a copper alloy. The pillar has a height of greater than 10 μm.

20 Claims, 15 Drawing Sheets

(52) U.S. Cl.
CPC .............. *H01L 2224/13139* (2013.01); *H01L 2224/13147* (2013.01); *H01L 2224/13155* (2013.01); *H01L 2224/16145* (2013.01); *H01L 2224/81* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01)

(56) References Cited

U.S. PATENT DOCUMENTS

| | | | |
|---|---|---|---|
| 8,269,345 B2 | 9/2012 | Patel | |
| 8,492,891 B2 | 7/2013 | Lu et al. | |
| 8,637,392 B2 | 1/2014 | Arvin et al. | |
| 9,018,760 B2 | 4/2015 | Arvin et al. | |
| 9,147,661 B1 | 9/2015 | Kwon et al. | |
| 9,177,830 B1 | 11/2015 | Wu et al. | |
| 9,299,680 B2 | 3/2016 | Lin et al. | |
| 9,520,370 B2 | 12/2016 | Gandhi | |
| 9,806,052 B2 | 10/2017 | Keser et al. | |
| 2008/0088013 A1* | 4/2008 | Chew | H01L 24/14 257/735 |
| 2011/0291262 A1 | 12/2011 | Shen et al. | |
| 2012/0007228 A1* | 1/2012 | Lu | H01L 24/13 257/692 |
| 2012/0007230 A1* | 1/2012 | Hwang | H01L 24/03 257/737 |
| 2012/0129333 A1* | 5/2012 | Yim | H01L 24/11 438/613 |
| 2014/0054768 A1* | 2/2014 | Yoshida | H01L 24/13 257/737 |
| 2014/0061897 A1* | 3/2014 | Lin | H01L 24/14 257/737 |
| 2014/0264890 A1* | 9/2014 | Breuer | H01L 24/11 257/773 |
| 2015/0001704 A1* | 1/2015 | Lu | H01L 24/14 257/737 |
| 2015/0262949 A1* | 9/2015 | Osenbach | H01L 24/14 438/113 |
| 2016/0351540 A1* | 12/2016 | Ogiso | H01L 23/481 |

FOREIGN PATENT DOCUMENTS

| | | |
|---|---|---|
| KR | 10-2014-0030902 A | 3/2014 |
| TW | 200924093 A | 6/2009 |
| TW | 201436678 A | 9/2014 |
| TW | 201642398 A | 12/2016 |
| TW | 201730996 A | 9/2017 |
| WO | 02/27790 A1 | 4/2002 |

* cited by examiner

SEMICONDUCTOR DEVICE WITH BUMP STRUCTURE AND METHOD OF MAKING SEMICONDUCTOR DEVICE

CROSS-REFERENCE TO RELATED APPLICATIONS

This application claims priority to U.S. Provisional Patent Application No. 62/591,534, filed Nov. 28, 2017, the entire disclosure of which is incorporated herein by reference.

BACKGROUND

As consumer devices with ever better performance have gotten smaller and smaller in response to consumer demand, the individual components of these devices have necessarily decreased in size as well. Semiconductor devices, which make up major components of consumer devices such as mobile phones, computer tablets, and the like, have become smaller and smaller. The decrease in size of semiconductor devices has been met with advancements in semiconductor manufacturing techniques such as forming connections between semiconductor devices.

As electronic industry develops three dimensional integrated circuits (3D IC) on the basis of through-Si-vias (TSV) technology, the processing and reliability of bumps, which are used to interconnect the stacked chips, is being actively investigated. In the course of reduction in size of the bumps, the diameter of a bump is reduced to about one order of magnitude smaller than that of flip chip solder joints, and the volume is about 1000 times smaller. The much smaller size of the solder joints increases the possibility of failure of the bump solder joints.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a plan view and FIG. 2B is a cross-sectional view along line A-A of FIG. 2A.

FIG. 10A is a cross-sectional view along line B-B of the plan view of FIG. 10B.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
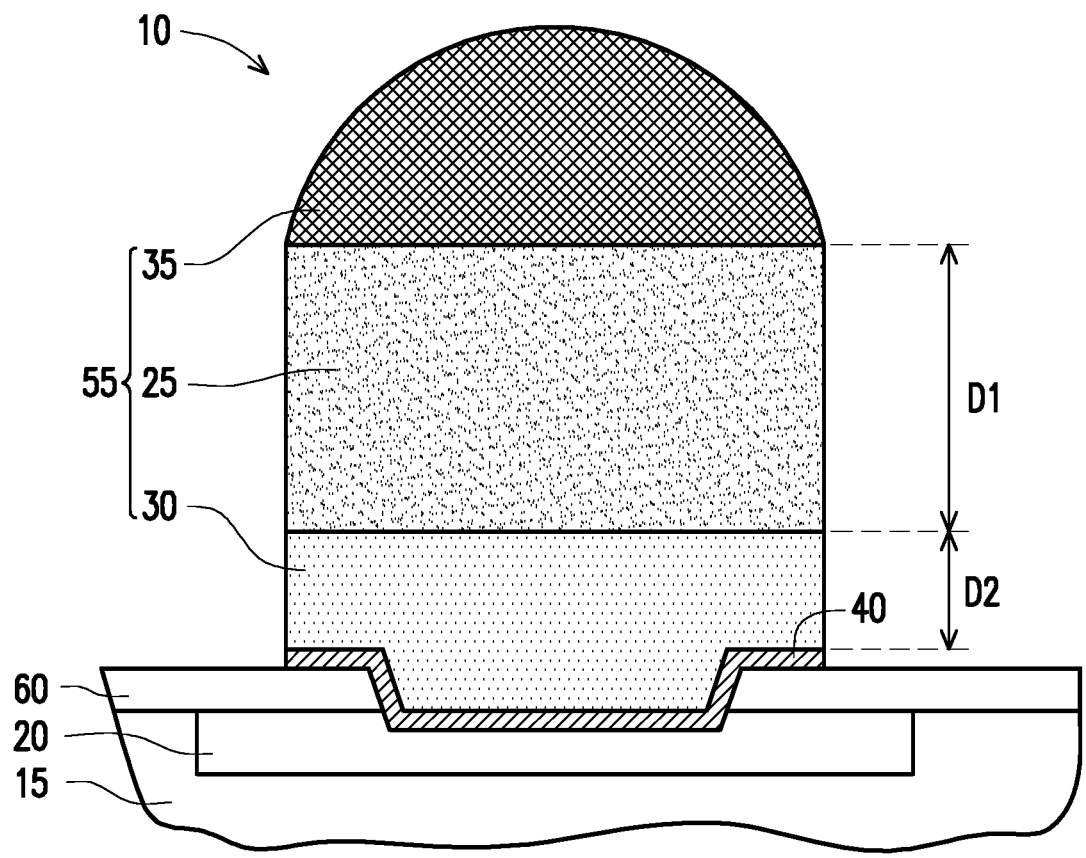
FIG. 1 is a schematic view of a bump structure according to an embodiment of the disclosure.

FIG. 1 is a schematic view of a bump structure according to an embodiment of the disclosure. A semiconductor device 10 has a substrate 15 and at least one bump structure 55 disposed on the substrate 15. A bonding pad 20 is disposed on the substrate 15. The bonding pad 20 is electrically connected to circuitry of the substrate 15. The bump structures 55 are connected to the circuitry of the substrate 15 via the bonding pad 20. The at least one bump structure 55 includes a pillar 25 formed mainly of a metal having a lower solderability (wettability) than copper or a copper alloy to a solder alloy. In other words, the metal having a lower solderability (or wettability), is less likely to form an intermetallic compound (or alloy) with a component of the solder alloy at the interface of the metal and the solder alloy than copper or copper alloy. Because the pillar has a lower solderability than copper or a copper alloy, solder flow down the side of the pillar is inhibited. In some embodiments, the pillar 25 is formed of a nickel-based material. In some embodiments, nickel-based material includes nickel and nickel alloys containing 50 mol % or greater nickel. In some embodiments, the bump structure 55 includes only one nickel-based layer 25. In some embodiments, the semiconductor device 10 includes an under bump metallization 40 disposed on the bonding pad 20 between the pillar 25 and the substrate 15.

In some embodiments, the bump structure 55 includes a Cu or Cu alloy layer 30 disposed between the pillar 25 and the under bump metallization 40. In some embodiments, the metal having a lower solderability (or wettability) is selected so that formation of the intermetallic compound is very slow, thereby preventing the solder from moving across the height of pillar 25 and contacting the underlying Cu or Cu alloy layer 30. An insulating layer 60 is formed over the substrate 15 and surrounding the under bump metallization 40 in some embodiments.

In some embodiments, the bonding pads 20 are formed of a suitable conductive metal, including aluminum, copper, silver, gold, nickel, tungsten, titanium, alloys thereof, and/or multilayers thereof.

In some embodiments, the bump structure 55 includes a solder layer 35 disposed on the pillar 25. In some embodiments, the solder layer 35 is formed of a tin-containing alloy such as AgSn, SnAgCu, PbSn, and CuSn. In some embodiments, the solder layer 35 is in direct physical contact with an upper surface of the pillar 25. In some embodiments, the solder layer 35 is not in direct physical contact with the Cu or Cu alloy layer 30.

In some embodiments, the pillar 25 has a height D1 greater than 10 µm to about 30 µm. At a pillar height D1 of greater than 10 µm, the pillar 25 has a sufficient height so that the solder is inhibited from rapidly flowing down the bump and forming voids in the solder bond or making contact with other semiconductor device features and causing a short circuit. The pillar height D1 is greater than a typical cap layer height. Cap layers are used as barrier layers in conventional bump structures to prevent Cu in the Cu or Cu alloy layer from diffusing into the solder layer. At pillar heights greater than about 30 µm, the device density decreases in an integrated circuit due to the increased spacing between the integrated circuit components. In some embodiments, the pillar 25 has a diameter ranging from about 5 µm to about 40 µm. In some embodiments, the pillar 25 has a diameter ranging from about 20 µm to about 25 µm.

In an embodiment, the semiconductor device 10 includes a Cu or Cu alloy layer 30 having a height D2 of about 5 µm to about 10 µm between the pillar 25 and the upper surface of the under bump metallization 40. In some embodiments, the height D1 of the pillar 25 is greater than the height D2 of the Cu or Cu alloy layer 30. In some embodiments, a ratio of the height D1 of the pillar 25 to the height D2 of the Cu or Cu alloy layer 30 (D1/D2) ranges from about 6/1 to about 1.5/1. In some embodiments, a ratio of the height D1 of the pillar 25 to the height D2 of the Cu or Cu alloy layer 30 (D1/D2) ranges from about 5/1 to about 3/1. In some embodiments, a ratio of the height D1 of the pillar 25 to the height D2 of the Cu or Cu alloy layer 30 (D1/D2) ranges from about 4/1 to about 2/1.

In some embodiments, the material composition of the sidewalls of the bump structure 55 is substantially the same as the material composition of interior portions of the bump structure 55 at a given height. In other words, there are no intentionally formed layers on the sidewalls of the of the bump structure 55 in some embodiments. For example, in some embodiments there are no intentionally formed passivation layers, such as a nitride layer, on the sidewall of the pillar 25.

The semiconductor device 10 is a device die that includes active devices such as transistors therein, in some embodiments. In other embodiments, the semiconductor device 10 includes a package substrate or an interposer having device dies formed thereon. In some embodiments, the bump structures 55 are used to bond a semiconductor chip or die to an interposer, a package substrate, or another semiconductor chip or die.

Figure 2A:
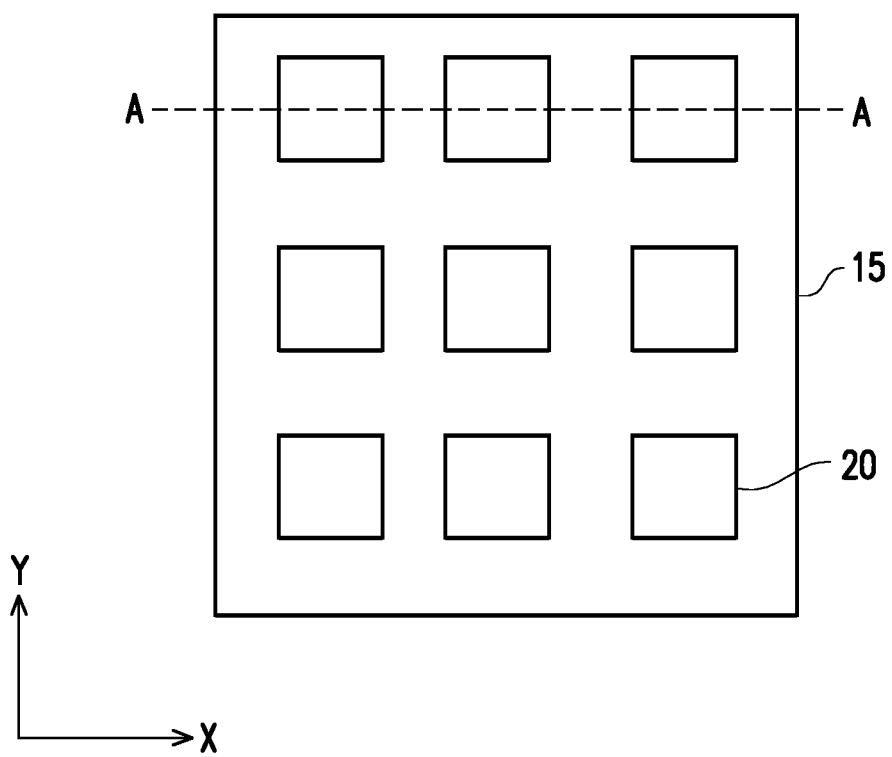
FIGS. 2A and 2B illustrate one of the various operations of a method of fabricating a semiconductor device according to an embodiment of the disclosure.
Figure 2B:
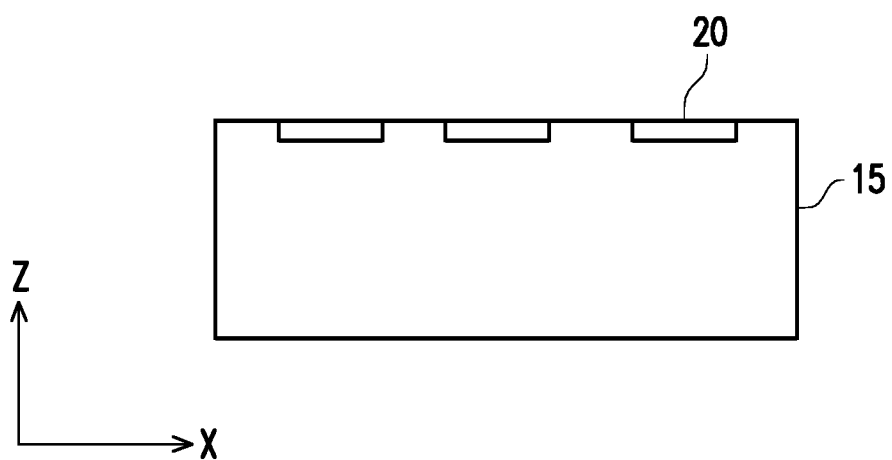

FIGS. 2A and 2B illustrate one of the various operations of a method of fabricating a semiconductor device according to an embodiment of the disclosure. FIG. 3A is a plan view and FIG. 3B is a cross-sectional view along line A-A of FIG. 3A. As shown in FIG. 3A, a plurality of bonding pads 20, on which bumps are to be formed, are arranged on the surface of a substrate 15. The bonding pads 20 are formed of a suitable conductive metal, including aluminum, copper, silver, gold, nickel, tungsten, titanium, alloys thereof, and/or multilayers thereof. The bonding pads are formed by a suitable metal deposition operation, including electro or electroless plating, physical vapor deposition (PVD) including sputtering, chemical vapor deposition (CVD), atomic layer deposition (ALD), thermal evaporation, or electron beam evaporation. The bonding pads 20 are arranged in a row-column arrangement in some embodiments.

Figure 3:
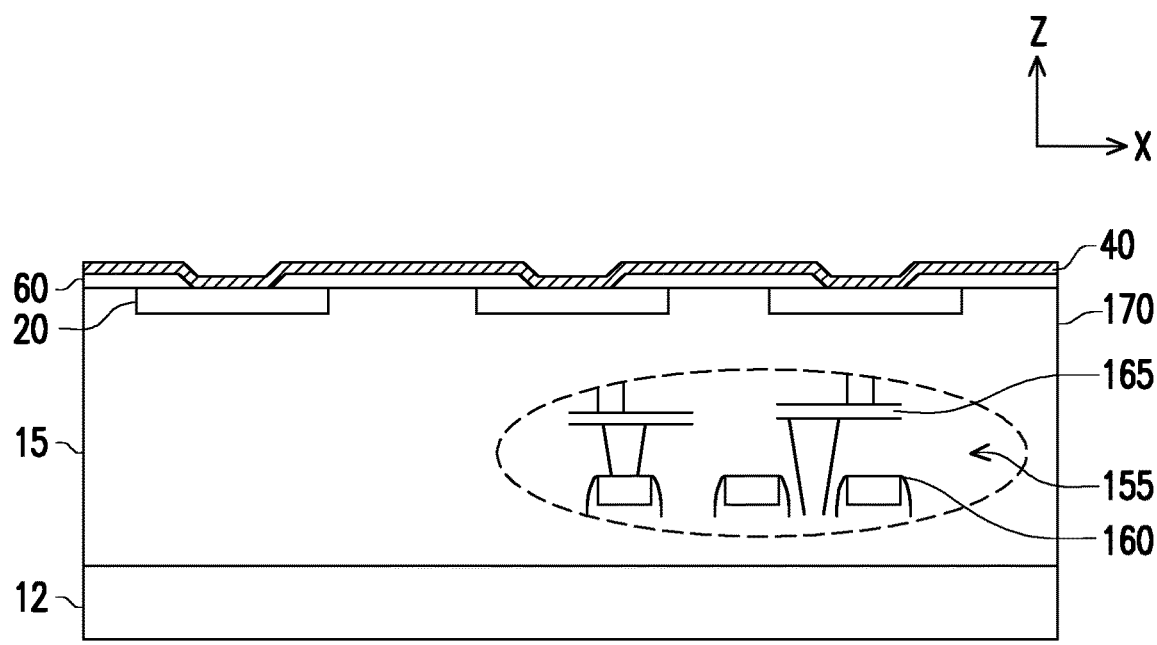
FIG. 3 is a cross-sectional view illustrating one of the various operations of a method of fabricating a semiconductor device according to an embodiment of the disclosure.

FIGS. 3-10B are cross-sectional views illustrating various stages of a method of fabricating a semiconductor device according to embodiments of the disclosure. An under bump metallization 40 is formed over the bonding pads and the insulating layer 60 in some embodiments, as shown in FIG. 3.

In some embodiments, circuitry 155 including devices 160, is disposed on the substrate 12. The devices 160 include transistors, capacitors, inductors, resistors, or the like in some embodiments. The bonding pads 20 and the bump structures 55 are electrically coupled to the circuitry 155 in some embodiments, through underlying interconnections 165, including wiring layers and vias. The wiring layers and vias of the interconnections 165 may be formed of copper or copper alloys, aluminum, tungsten, nickel, or any other suitable metal. The wiring layers and vias may be formed using damascene processes. The circuitry 155 is embedded in an insulating layer 170, such as interlayer dielectric (ILD) layer or intermetal dielectric (IMD) layer in some embodiments.

In some embodiments, the substrate 15 includes a semiconductor base 12. The semiconductor base 12 is formed of at least one selected from the group consisting of silicon, diamond, germanium, SiGe, SiGeSn, SiGeC, GeSn, SiSn, GaAs, InGaAs, InAs, InP, InSb, GaAsP, GaInP, and SiC. In some embodiments, the semiconductor base 12 is a silicon wafer.

An insulating layer 60 is formed over the substrate 15 in some embodiments. In some embodiments, the insulating layer 60 is an oxide layer. The insulating layer 60 is patterned using suitable photolithography and etching operations to form openings, in which the under bump metallization 40 is deposited in some embodiments. In some embodiments, the under bump metallization is formed by a suitable metal deposition operation, including electro or electroless plating, physical vapor deposition (PVD) including sputtering, chemical vapor deposition (CVD), atomic layer deposition (ALD), thermal evaporation, and electron beam evaporation. In some embodiments, a seed layer (not shown) is deposited on the bonding pad before the under bump metallization is formed. In some embodiments, the under bump metallization 40 extends over the insulating layer 60, and excess under bump metallization is removed by a suitable operation, such as chemical mechanical polishing (CMP).

In an embodiment, the under bump metallization 40 includes a titanium-based layer disposed on the pad 20, and a sputter deposited copper-based layer disposed on the titanium-based layer. A titanium-based material includes titanium, and titanium alloys and titanium compounds containing 50 mol % or greater titanium. A copper-based material includes copper, and copper alloys and copper compounds containing 50 mol % or greater copper. In an embodiment, the titanium-based layer is a sputter-deposited layer of Ti or TiW having a thickness ranging from 20 nm to 70 nm.

Figure 4:
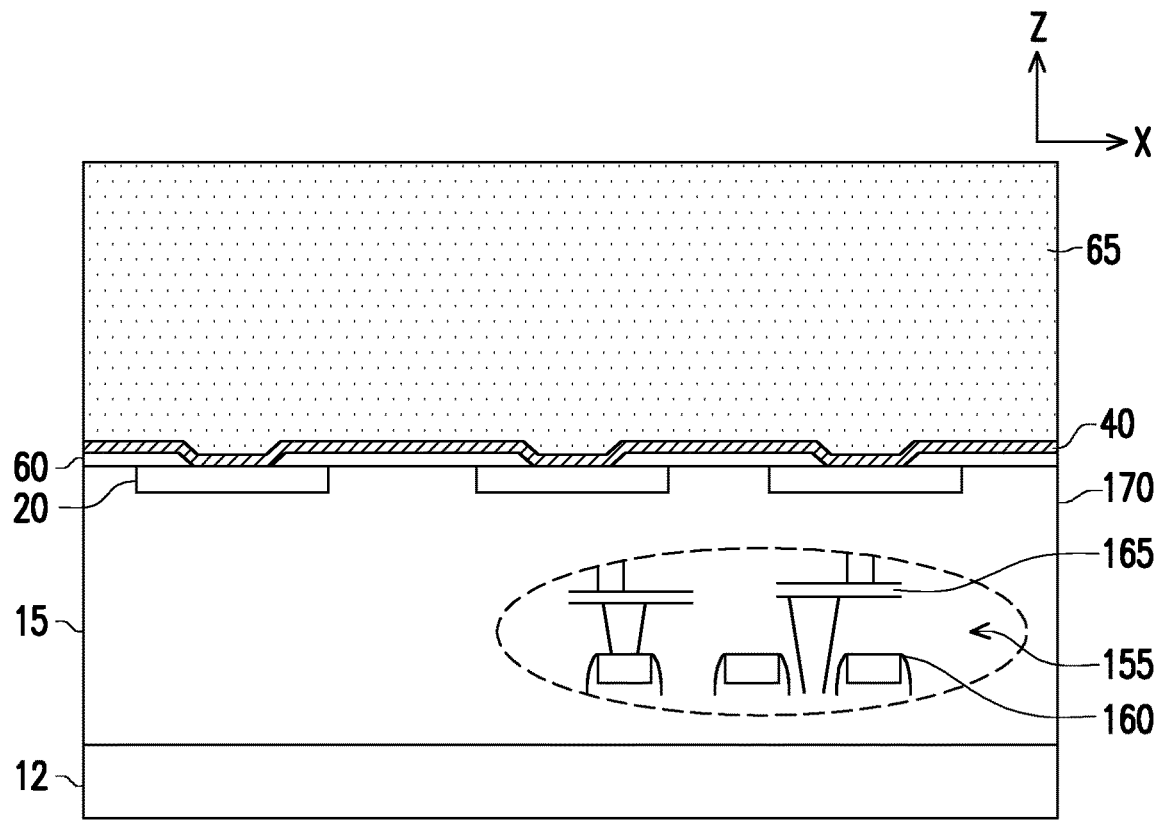
FIG. 4 is a cross-sectional view illustrating one of the various operations of a method of fabricating a semiconductor device according to an embodiment of the disclosure.

Next, a photoresist layer 65 is formed over the under bump metallization 40 and insulating layer 60, as shown in FIG. 4 in some embodiments of the disclosure. The photoresist layer 65 can be a positive photoresist or a negative photoresist. When the photoresist is a positive resist, the portion of the photoresist exposed to the actinic radiation becomes soluble in the developer and is removed during the development operation. When the photoresist is a negative photoresist, the portion of the photoresist exposed to actinic radiation becomes insoluble in the developer and remains on the device, while the portion not exposed to the actinic radiation is removed, during the development operation. In some embodiments, the actinic radiation is ultraviolet radiation including i-line and g-line radiation, and deep ultraviolet radiation; extreme ultraviolet (EUV) radiation; and electron beam radiation. In some embodiments, the actinic radiation is generated by a mercury arc lamp, or a laser, including ArF and KrF excimer lasers; and laser excited tin plasma.

Figure 5:
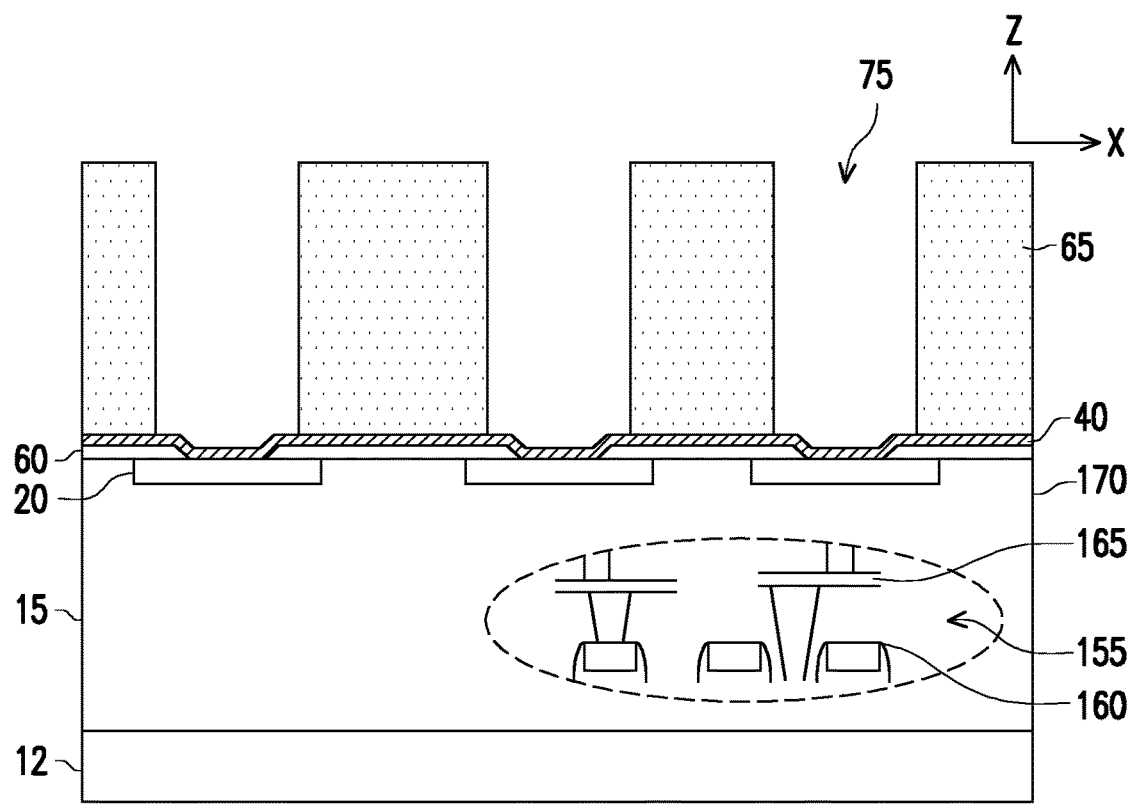
FIG. 5 is a cross-sectional view illustrating one of the various operations of a method of fabricating a semiconductor device according to an embodiment of the disclosure.

The photoresist layer 65 is subsequently selectively exposed to actinic radiation, and developed to form a plurality of openings 75 exposing the under bump metallization 40, as shown in FIG. 5. In some embodiments, the openings 75 are substantially circular having a diameter ranging from about 10 μm to about 40 μm. In some embodiments, the openings 75 have a diameter ranging from about 20 μm to about 25 μm.

Figure 6:
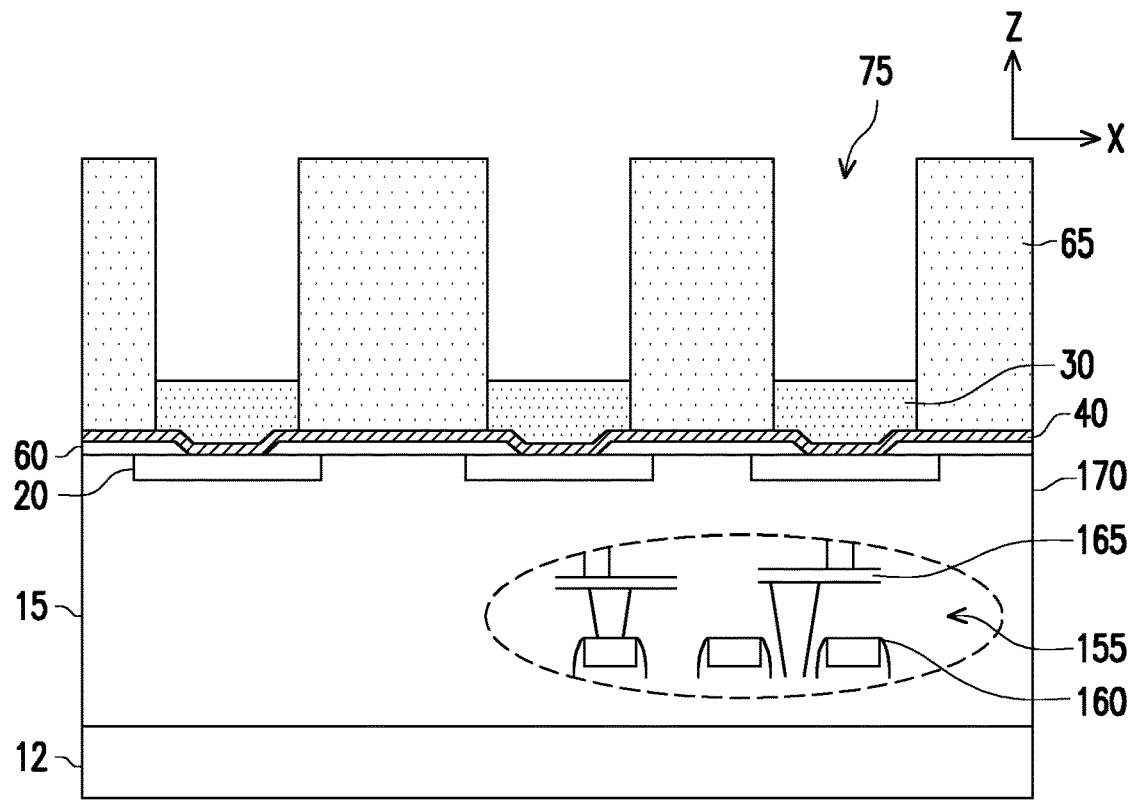
FIG. 6 is a cross-sectional view illustrating one of the various operations of a method of fabricating a semiconductor device according to an embodiment of the disclosure.

A first metal layer 30 is subsequently formed in the openings 75 over the under bump metallization 40 in some embodiments, as shown in FIG. 6. The first metal layer 30 is copper or a copper alloy in some embodiments. The first metal layer 30 may be formed by a suitable metal deposition operation, including electro or electroless plating, physical vapor deposition (PVD) including sputtering, chemical vapor deposition (CVD), atomic layer deposition (ALD), thermal evaporation, and electron beam evaporation. In some embodiments, a seed layer (not shown) is deposited on the under bump metallization before the first metal layer is formed. The first metal layer is deposited to a thickness of about 5 μm to about 10 μm in some embodiments.

Figure 7:
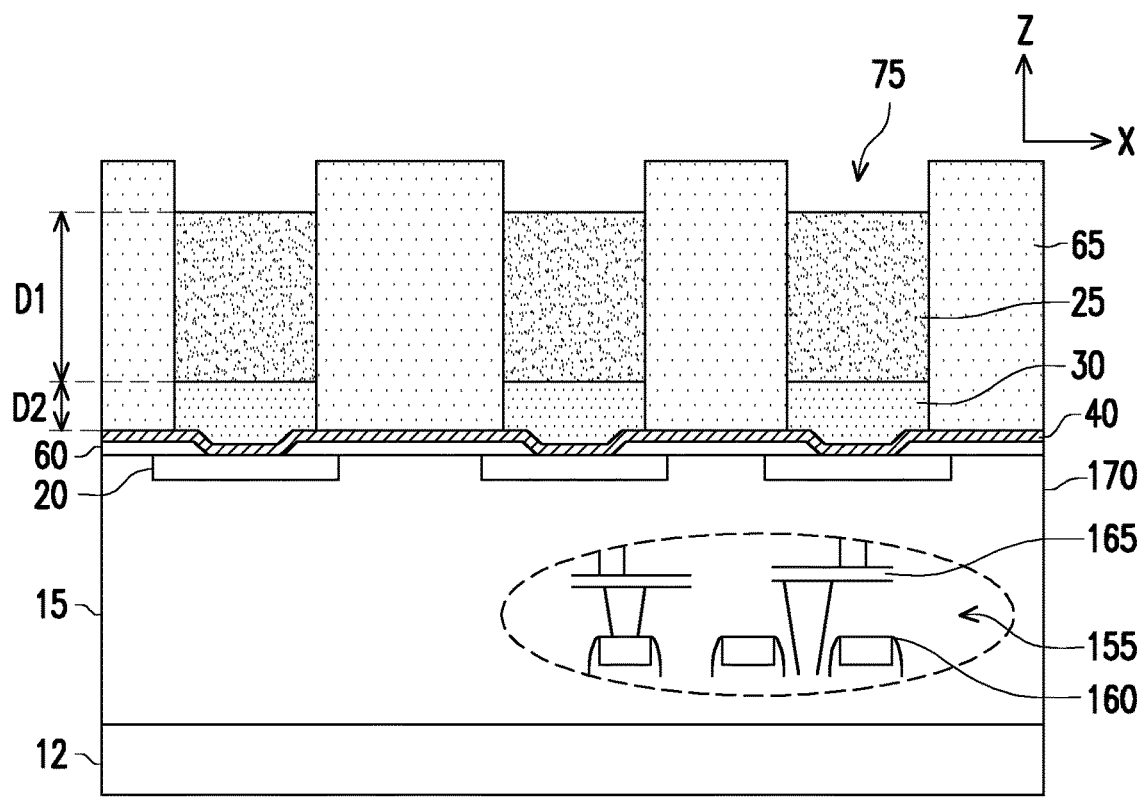
FIG. 7 is a cross-sectional view illustrating one of the various operations of a method of fabricating a semiconductor device according to an embodiment of the disclosure.

Adverting to FIG. 7, a second metal layer 25 is formed in the openings 75 over the first metal layer 30. In some embodiments, the second metal layer 25 forms a pillar 25 of a metal having a lower solderability or wettability than copper or a copper alloy to a solder alloy.

In some embodiments, the height D1 of the second metal layer 25 is greater than the height D2 of the first metal layer 30. In some embodiments, the height D1 of the second metal layer 25 is greater than 10 μm to about 30 μm. In some embodiments, the second metal layer 25 has a diameter ranging from about 5 μm to about 40 μm. In some embodiments, the second metal layer 25 has a diameter ranging from about 20 μm to about 25 μm. In some embodiments, the first metal layer 30 has a height D2 of about 5 μm to about 10 μm between the second metal layer 25 and the upper surface of the under bump metallization 55. In some embodiments, a ratio of the height D1 of the second metal layer 25 to the height D2 of the first metal layer 30 (D1/D2) ranges from about 6/1 to about 1.5/1. In some embodiments, a ratio of the height D1 of the second metal layer 25 to the height D2 of the first metal layer 30 (D1/D2) ranges from about 5/1 to about 3/1. In some embodiments, the height D1 of the second metal layer 25 is greater than the height D2 of the first metal layer 30.

In some embodiments, the second metal layer or pillar 25 is formed mainly of a metal selected from the group consisting of aluminum, chromium, iron, manganese, magnesium, molybdenum, nickel, niobium, tantalum, titanium, tungsten, zinc, and alloys thereof. In some embodiments, the second metal layer or pillar 25 is formed of a nickel-based material. In some embodiments, the nickel-based material includes nickel and nickel alloys containing 50 mol % or greater nickel. The second metal layer or pillar 25 is formed by a suitable metal deposition operation, including electro or electroless plating, physical vapor deposition (PVD) including sputtering, chemical vapor deposition (CVD), atomic layer deposition (ALD), thermal evaporation, and electron beam evaporation in some embodiments.

Figure 8:
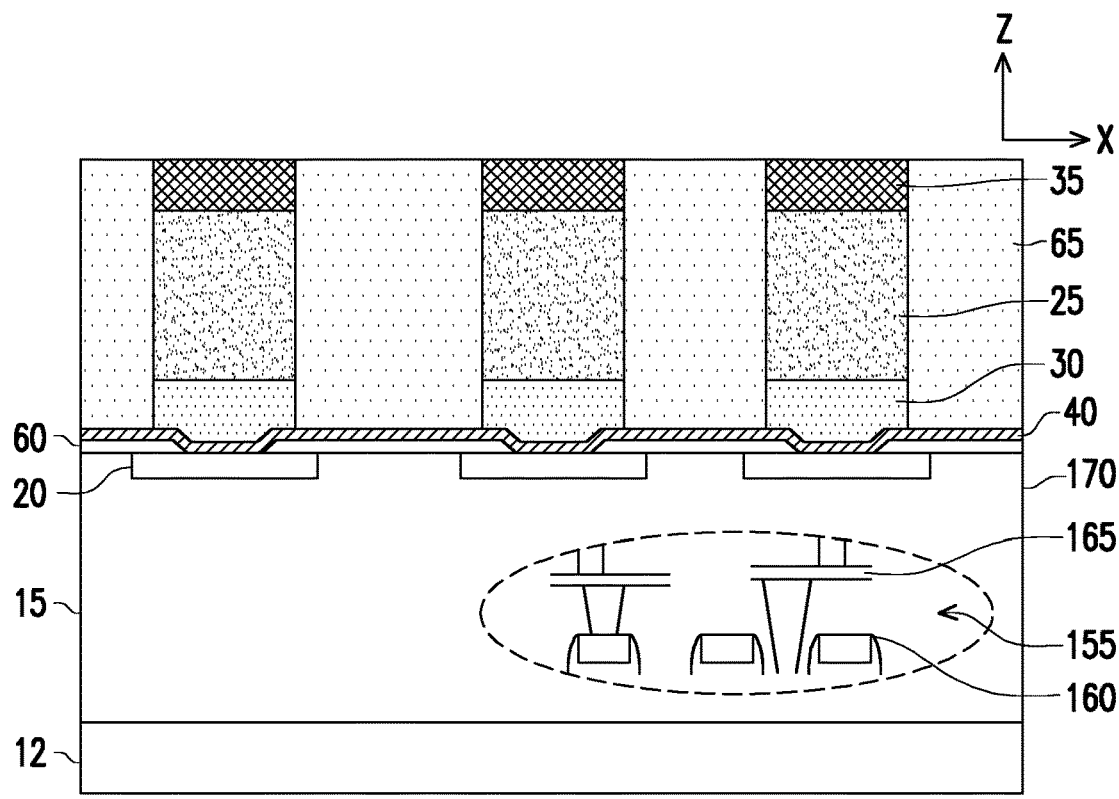
FIG. 8 is a cross-sectional view illustrating one of the various operations of a method of fabricating a semiconductor device according to an embodiment of the disclosure.

As shown in FIG. 8, a solder layer 35 is subsequently formed in the openings over the second metal layer 25 in some embodiments. The solder layer 35 includes an eutectic solder, such as an alloy selected from the group consisting of AgSn, SnAgCu, PbSn, and CuSn in some embodiments. Other suitable solders may be used as long as the pillar has a lower solderability (wettability) to the solder than copper or copper alloys. The thickness of the solder layer 35 is about 2 μm to about 10 μm in some embodiments. In some embodiments, excess solder is removed from above the photoresist layer 65.

Figure 9:
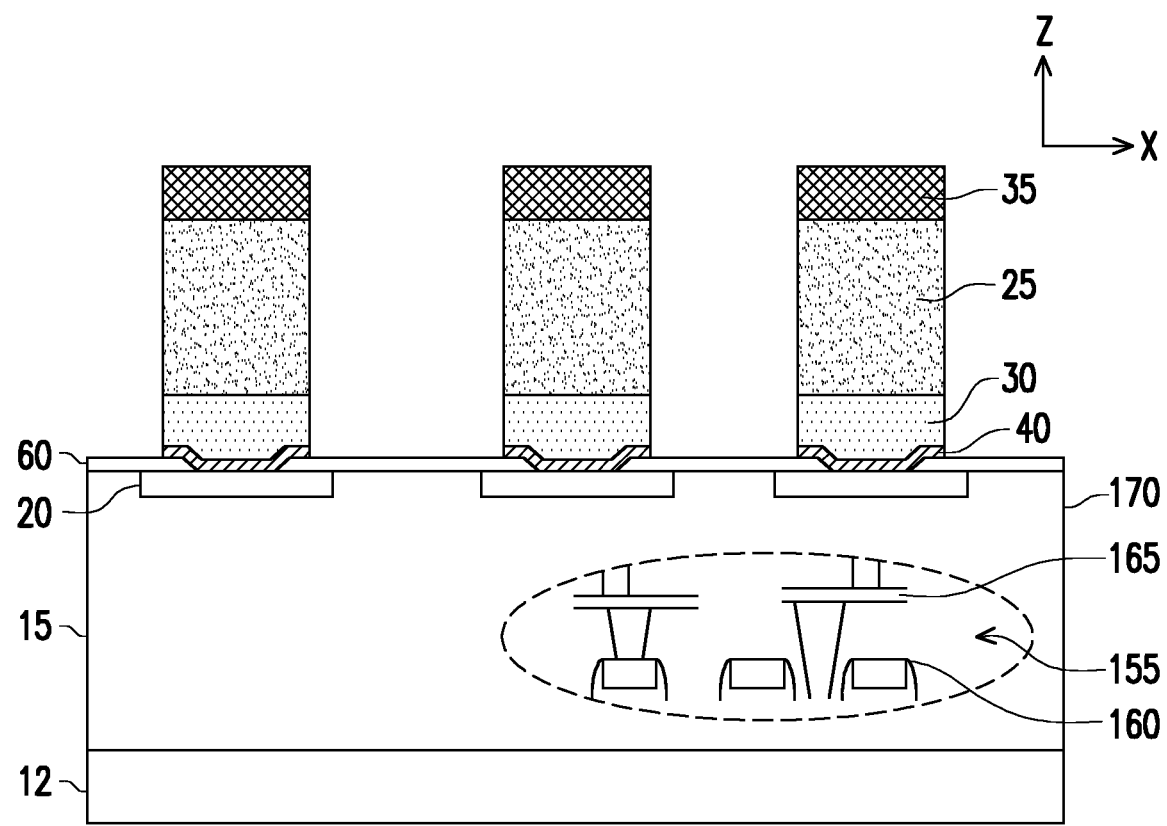
FIG. 9 is a cross-sectional view illustrating one of the various operations of a method of fabricating a semiconductor device according to an embodiment of the disclosure.

The photoresist layer 65 is subsequently removed, as shown in FIG. 9 to expose the sidewalls of the solder layer 35, pillar 25, and the first metal layer 30. The photoresist layer 65 is removed using a suitable photoresist stripper in some embodiments. Then exposed portions of the under bump metallization 40 are removed such as by a suitable etching operation.

Figure 10A:
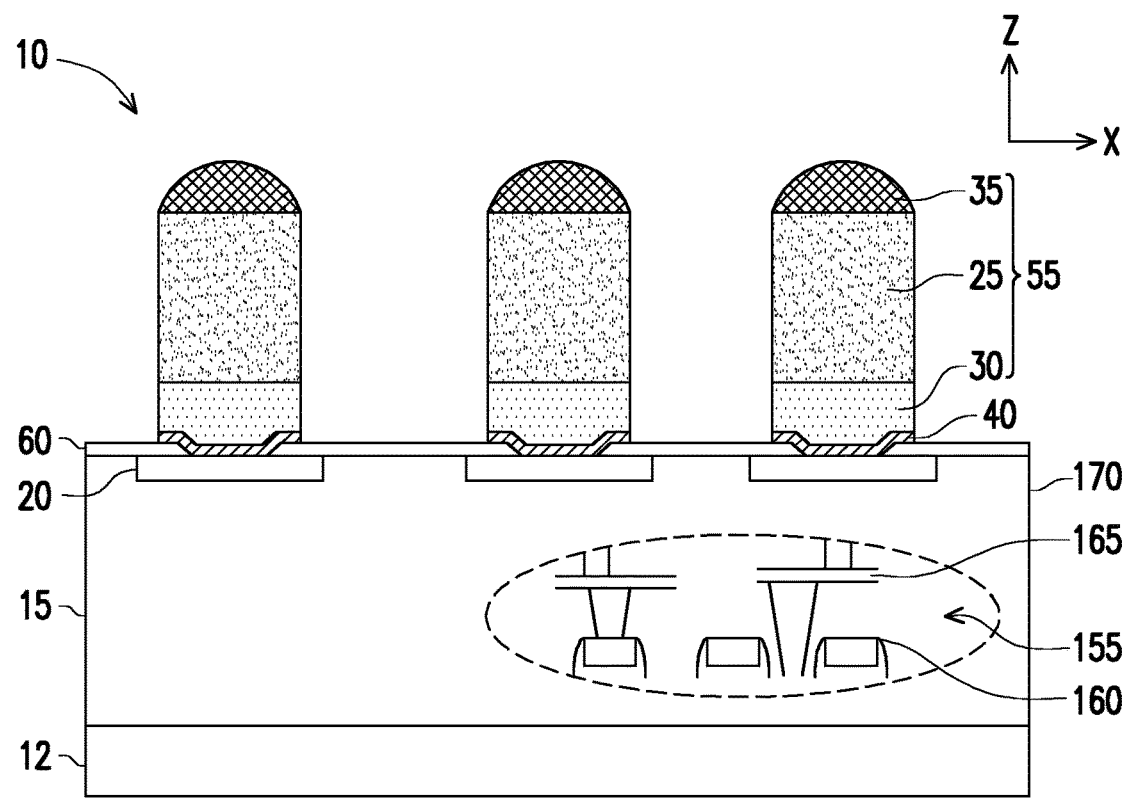
FIGS. 10A and 10B illustrate one of the various operations of a method of fabricating a semiconductor device according to an embodiment of the disclosure.

After removal of the photoresist layer 65, the solder layer 35 is reflowed to form a smooth, hemispherical shape in some embodiments, as shown in FIG. 10A, to provide a semiconductor device 10 having a plurality of bump structures 55. FIG. 10A is a cross-sectional view along line B-B of the plan view of FIG. 10B. The solder layer 35 is reflowed by heating the solder to a temperature at which it softens and flows.

Figure 10B:
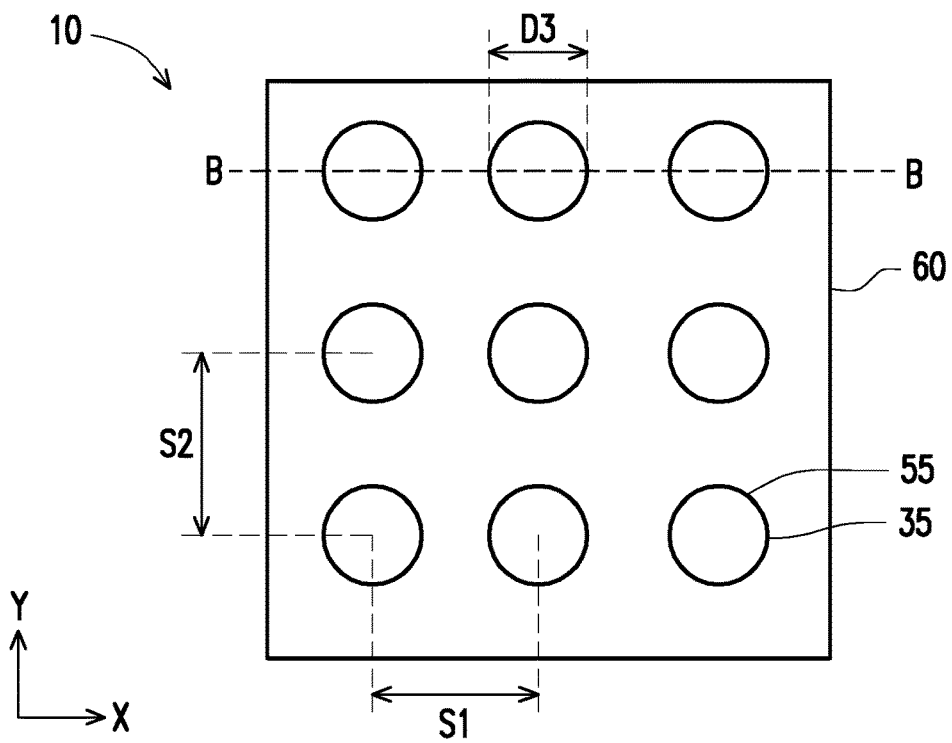

FIG. 10B is a plan view showing a row-column arrangement of the bump structures 55 on the semiconductor device 10. A 3×3 arrangement of bump structures is illustrated, but the disclosure is not limited to a 3×3 arrangement. Other arrangements, including fewer or greater number of rows or columns of bump structures are included in the scope of this disclosure. For example, the arrangement may be a 10×10 arrangement, or a greater number of column and rows. The arrangement of bump structures is not limited to a rectangular arrangement. In some embodiments, other arrangements include staggered rows and columns, where each bump structure is immediately adjacent to six other bump structures. In other embodiments, the bump structures are arranged in a concentric circular arrangement. In other embodiments, the bump structures are arranged around the periphery of the substrate or in a central portion of the substrate. In other embodiments, the bump structures are irregularly spaced. In some embodiments, up to about 10,000 bump structures are formed on the substrate.

In some embodiments, the bump structures 55 have a diameter D3 ranging from about 5 µm to about 40 µm as seen in plan view. In some embodiments, the bump structures 55 have a diameter D3 ranging from about 20 µm to about 25 µm. In some embodiments, the plurality of bump structures 55 are arranged in a row-column arrangement having a pitch S1 of about 15 µm to about a 60 µm from the center of one bump structure 55 to the center of an adjacent bump structure 55 in the X direction. In some embodiments, the plurality of bump structures 55 have a pitch S1 of about 25 µm to about 40 µm from the center of one bump structure 55 to the center of an adjacent bump structure 55 in the X direction. In some embodiments, the plurality of bump structures 55 have a pitch S2 of about 15 µm to about 60 µm from the center of one bump structure 55 to the center of an adjacent bump structure 55 in the Y direction. In some embodiments, the plurality of bump structures 55 have a pitch S2 of about 25 µm to about 40 µm from the center of one bump structure 55 to the center of an adjacent bump structure 55 in the Y direction.

In some embodiments, a ratio of the diameter D3 of the bump structure to the pitch S1 in the X direction ranges from about 1/12 to about 8/9. In some embodiments, a ratio of the diameter D3 of the bump structure to the pitch S1 in the X direction ranges from about 1/3 to about 2/3. In some embodiments, a ratio of the diameter D3 of the bump structure to the pitch S2 in the Y direction ranges from about 1/12 to about 8/9. In some embodiments, a ratio of the diameter D3 of the bump structure to the pitch S2 in the Y direction ranges from about 1/3 to about 2/3. In some embodiments, the pitch S1 in the X direction is substantially the same as the pitch S2 in the Y direction. In some embodiments, the pitch S1 in the X direction is greater than the pitch S2 in the Y direction. In some embodiments, the pitch S1 in the X direction is less than the pitch S2 in the Y direction.

It is understood that the device shown in FIGS. 10A and 10B undergoes further semiconductor processes to form various features such as external contacts, dielectric layers, integration into modules, etc.

Figure 11:
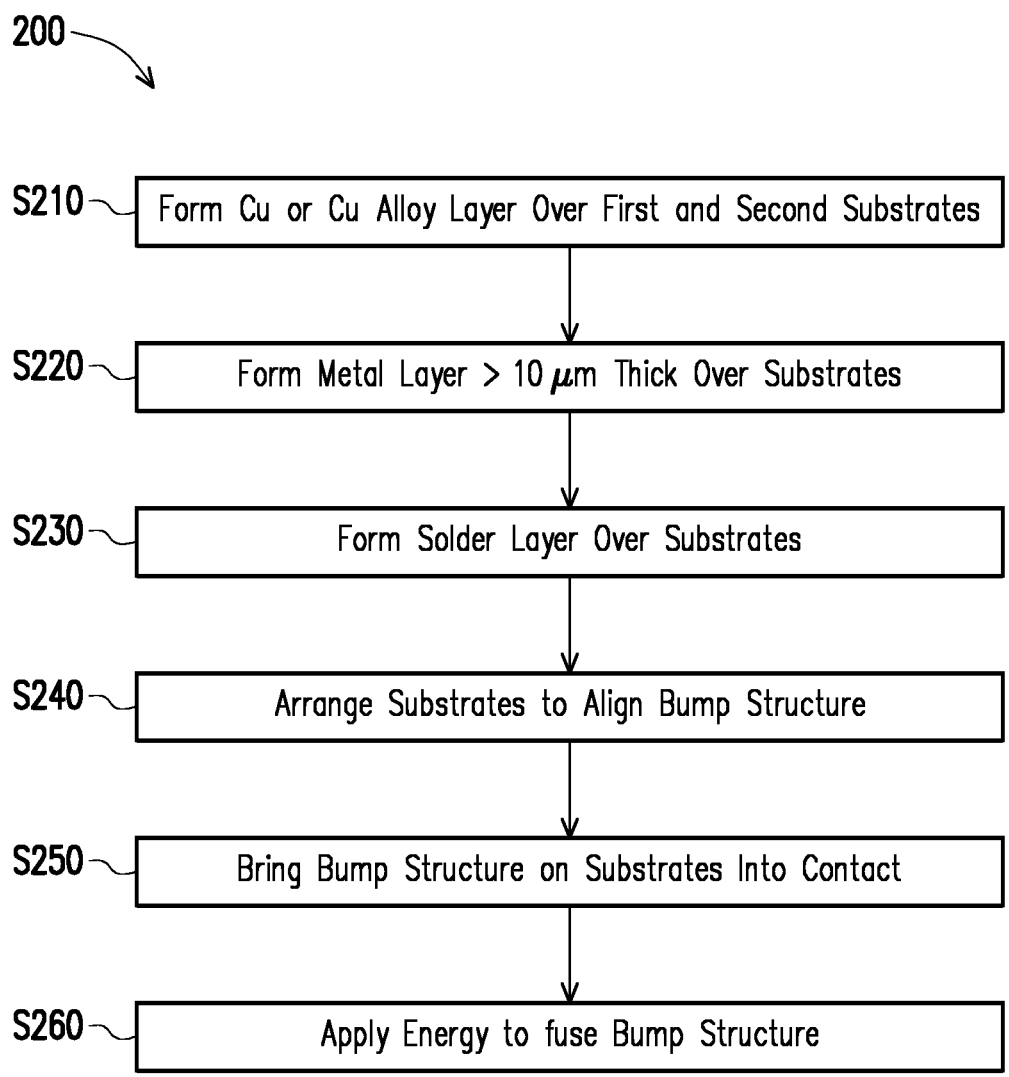
FIG. 11 is a flowchart illustrating a method of fabricating a semiconductor device according to an embodiment of the disclosure.

FIG. 11 is a flowchart illustrating another method 200 of fabricating a semiconductor device according to an embodiment of the disclosure. In operation S210, a copper or copper alloy layer is formed over first and second substrates. The copper or copper alloy layer may be formed by a suitable metal deposition operation, including electro or electroless plating, physical vapor deposition (PVD) including sputtering, chemical vapor deposition (CVD), atomic layer deposition (ALD), thermal evaporation, and electron beam evaporation. A metal having a lower solderability than copper or a copper alloy to a solder alloy having a thickness of greater than 10 µm is formed over each copper or copper alloy layer on the substrate in operation S220. In some embodiments, the copper or copper alloy layer has a thickness up to about 30 µm. In some embodiments, the solder alloy is selected from the group consisting of AgSn, SnAgCu, PbSn, and CuSn. The layer of metal having a lower solderability than copper or a copper alloy may be formed by a suitable metal deposition operation, including electro or electroless plating, physical vapor deposition (PVD) including sputtering, chemical vapor deposition (CVD), atomic layer deposition (ALD), thermal evaporation, and electron beam evaporation. A solder layer is subsequently formed over each layer of metal having a lower solderability than copper or a copper alloy on the substrate in operation S230, thereby forming a bump structure on each of the first substrate and the second substrate.

The first substrate and the second substrate are subsequently arranged so that the bump structure on the first substrate and the bump structure on the second substrate face each other and are aligned with each other in operation S240. Next, in operation S250, the bump structure on the first substrate and the bump structure on the second substrate are brought into contact with each other. Then energy is applied to the bumps so that solder layers on the bump structures flow and the bump structure on the first substrate and the bump structure on the second substrate fuse together in operation S260.

Figure 12:
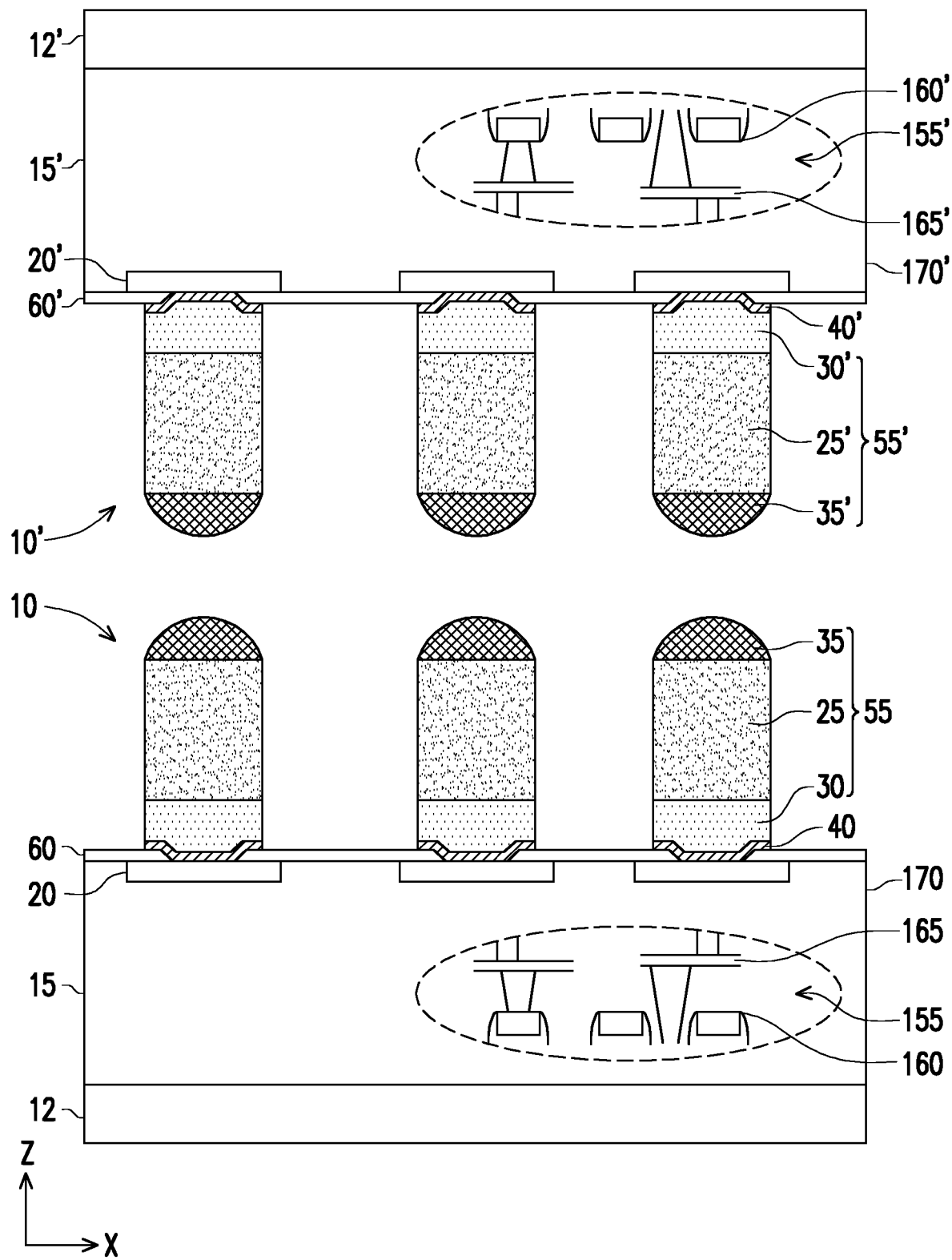
FIG. 12 is a cross-sectional view illustrating one of the various operations of a method of fabricating a semiconductor device according to an embodiment of the disclosure.

FIGS. 12-15 illustrate a method of fusing bump structures 55, 55' on two substrates 15, 15' together according to embodiments of the disclosure. As shown in FIG. 12, a first semiconductor device 10 and a second semiconductor device 10' include a plurality of bump structures 55 formed according to the operations described in FIGS. 2A-10B. The second semiconductor device 10' is oriented so that the solder layer 35 of the bump structures 55 in the first semiconductor device 10 is facing and aligned with the solder layer 35' of the bump structures 55' in the second semiconductor device 10'. In some embodiments, the second semiconductor device 10' is a package substrate, an interposer or a substrate without circuitry 155 formed therein.

Figure 13:
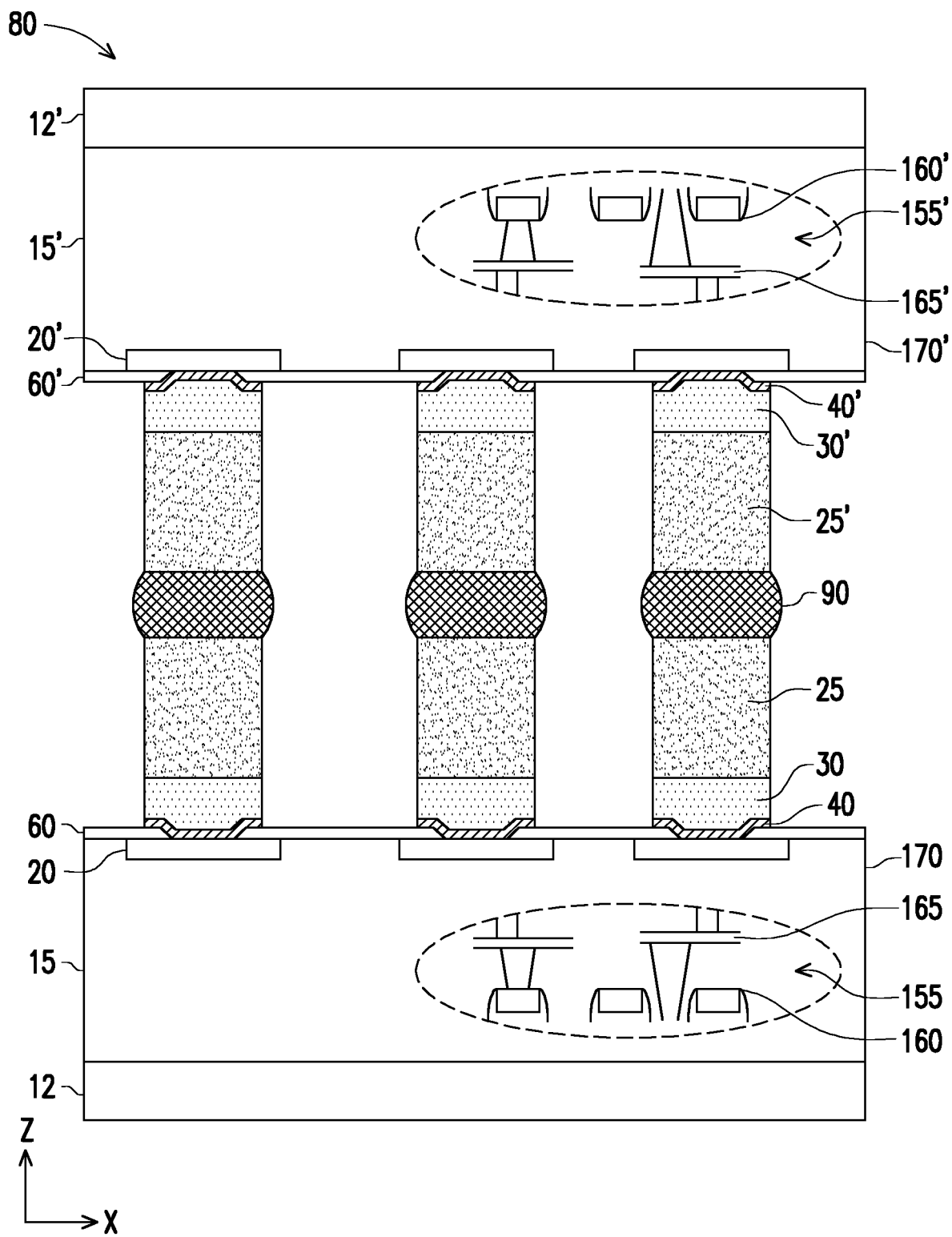
FIG. 13 is a cross-sectional view illustrating one of the various operations of a method of fabricating a semiconductor device according to an embodiment of the disclosure.

The bump structures 55 of the first and second semiconductor devices 10, 10' are brought into contact with each other and energy is applied to cause the solder layers 35, 35' to soften and flow into each other, and then fuse to form an intermetallic bond at the solder joint 90 where the first semiconductor device 10 and the second semiconductor device 10' are joined when the applied energy is removed, as shown in FIG. 13. In an embodiment, the first substrate 15 is bonded to the second substrate 15' through a pillar/solder/pillar connection after the substrates fuse together forming a semiconductor device 80, which is a combination of the first semiconductor device 10 and the second semiconductor device 10'. In some embodiments, the energy is thermal energy, ultrasonic energy, or a combination of thermal energy and ultrasonic energy. In some embodiments, the thermal energy is supplied by heated air, an infrared heat lamp, or a laser. In some embodiments, the ultrasonic energy is applied by an ultrasonic transducer.

Figure 14:
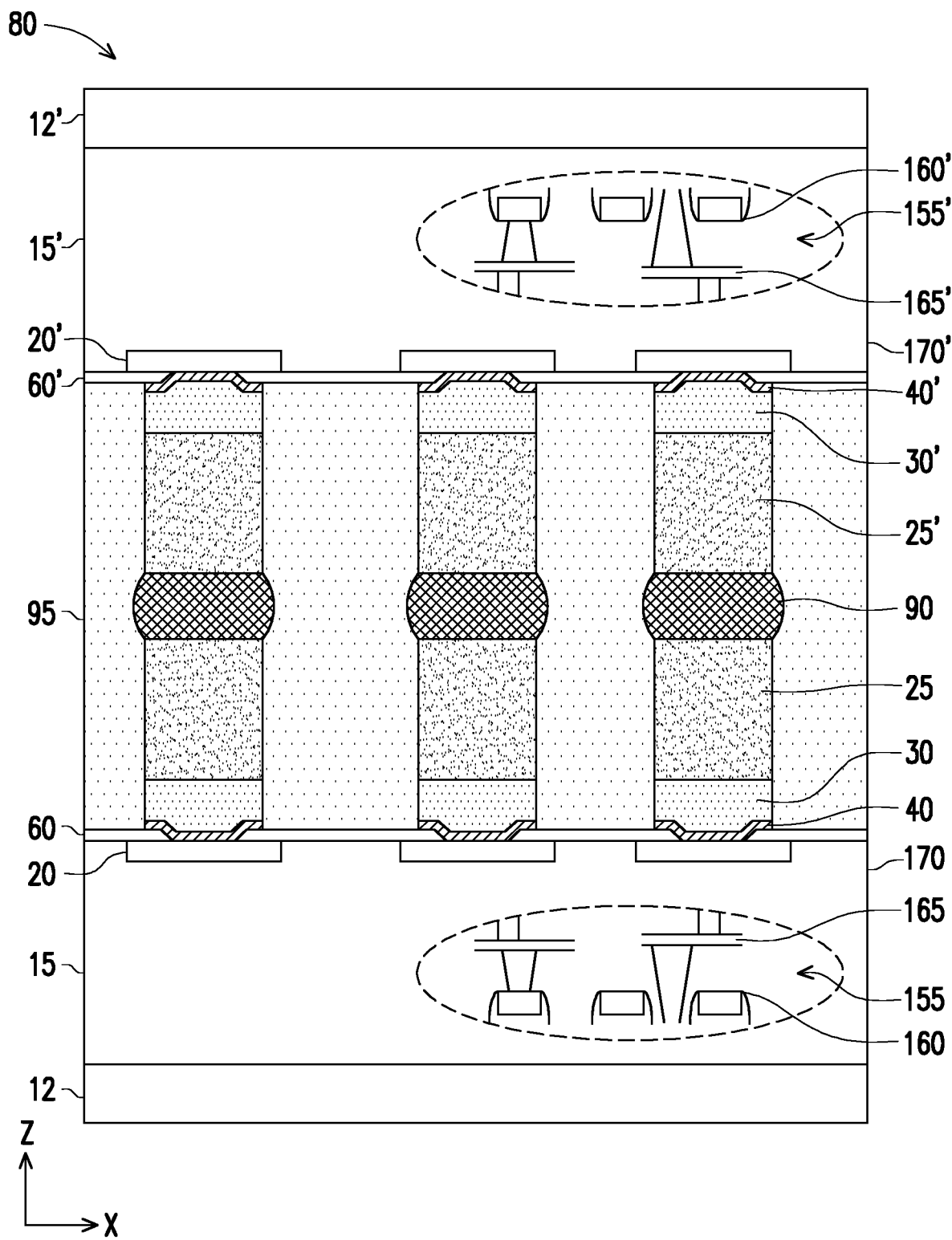
FIG. 14 is a cross-sectional view illustrating one of the various operations of a method of fabricating a semiconductor device according to an embodiment of the disclosure.

To increase the yield and prolong the life of the semiconductor device 80, an underfill material 95 is formed between the conjoined substrates 15, 15' in some embodiments, as shown in FIG. 14. The underfill material embeds the solder interconnects within the underfill material. The underfill material 95 mechanically couples the substrates 15, 15' and decreases the stress on the solder joints 90 to improve device yield and lifetime.

The underfill material 95 is a thermally curable liquid polymer resin in some embodiments. The underfill material 95 may be applied to an edge of the area between the first substrate 15 and the second substrate 15' and then the underfill material 95 is drawn into the void between the first substrate 15 and the second substrate 15' by capillary action. In some embodiments, several applications of the underfill material are performed to completely fill the void. In some embodiments, the application of the underfill material 95 is assisted by imposing a vacuum on the void prior to applying the underfill material 95. In some embodiments, the under filling operation is assisted by heating the underfill polymer resin to a temperature below the resin's curing point to reduce its viscosity.

In some embodiments, the underfill material is a liquid resin. In some embodiments, a variety of resins can be used as the underfill material, including thermosetting molding compounds such as silicones, epoxies, and polyamides. The epoxies include novalac-epoxy resins. The underfill resins may optionally contain fillers, such as silica, alumina, talc, or the like.

Figure 15:
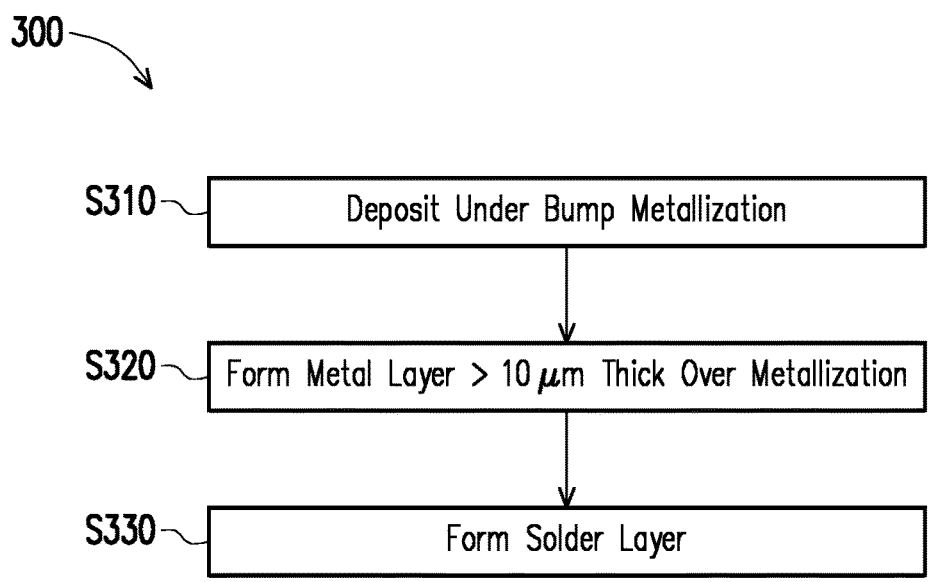
FIG. 15 is a flowchart illustrating a method of fabricating a semiconductor device according to an embodiment of the disclosure.
Figure 16:
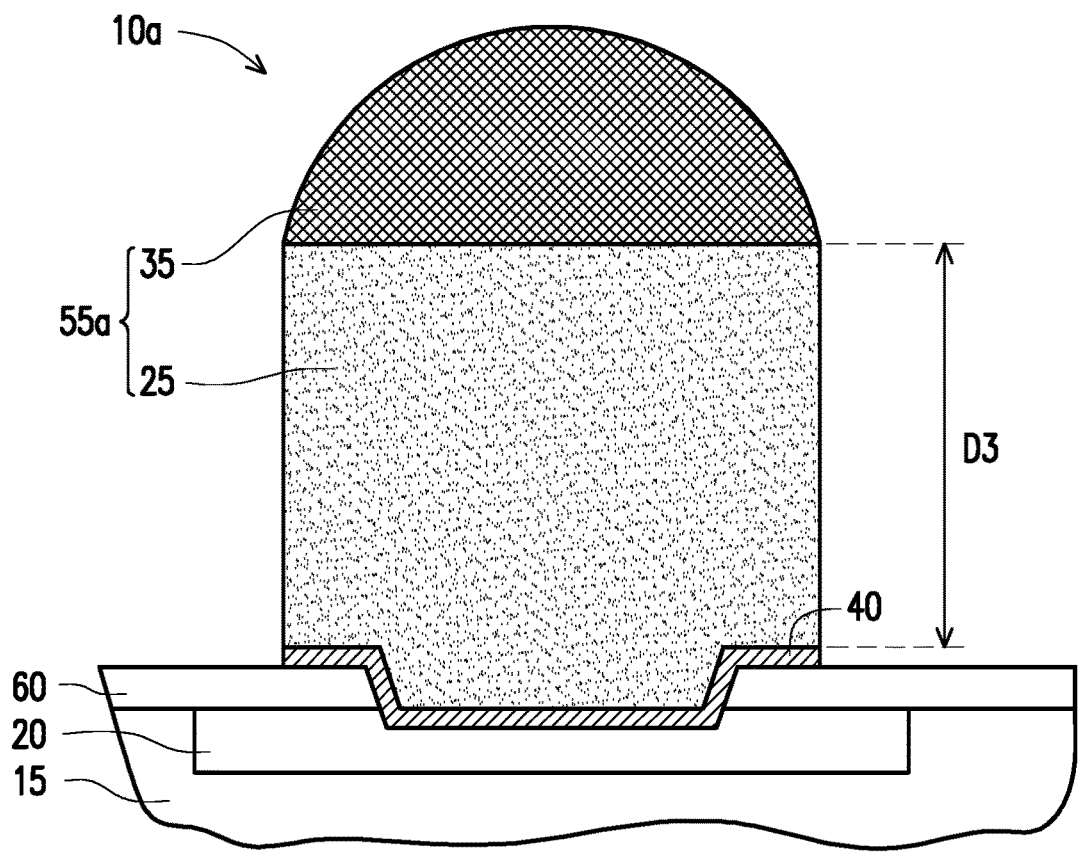
FIG. 16 is a schematic view of a bump structure according to an embodiment of the disclosure.

FIG. 15 is a flowchart illustrating a method 300 of fabricating a semiconductor device 10a having a bump structure 55a according to another embodiment of the disclosure. The semiconductor device 10a formed according to the method 300 of FIG. 15 is illustrated in FIG. 16. The semiconductor device 10a has a substrate 15 and at least one bump structure 55a disposed on the substrate 15. An under bump metallization 40 is deposited over the substrate 15 in operation S310. In some embodiments, the under bump metallization 40 includes titanium-based layers and/or copper-based layers. The under bump metallization 40 has a thickness of about 5 nm to about 500 nm in some embodiments. After depositing the under bump metallization, a metal layer having a lower solderability than copper or a copper alloy to a solder alloy having a height D3 measured from the upper surface of the under bump metallization 40 of greater than 10 μm is formed over the under bump metallization in operation S320 to form a pillar 25. In some embodiments, the pillar 25 is a nickel based material, formed by a suitable metal deposition operation, including electro or electroless plating, physical vapor deposition (PVD) including sputtering, chemical vapor deposition (CVD), atomic layer deposition (ALD), thermal evaporation, and electron beam evaporation. A solder layer 35 is subsequently formed on the nickel-based layer 25 in operation S330, thereby forming the bump structure 55a.

It is understood that the device shown in FIG. 16 undergoes further semiconductor processes to form various features such as external contacts, dielectric layers, integration into modules, etc.

Figure 17:
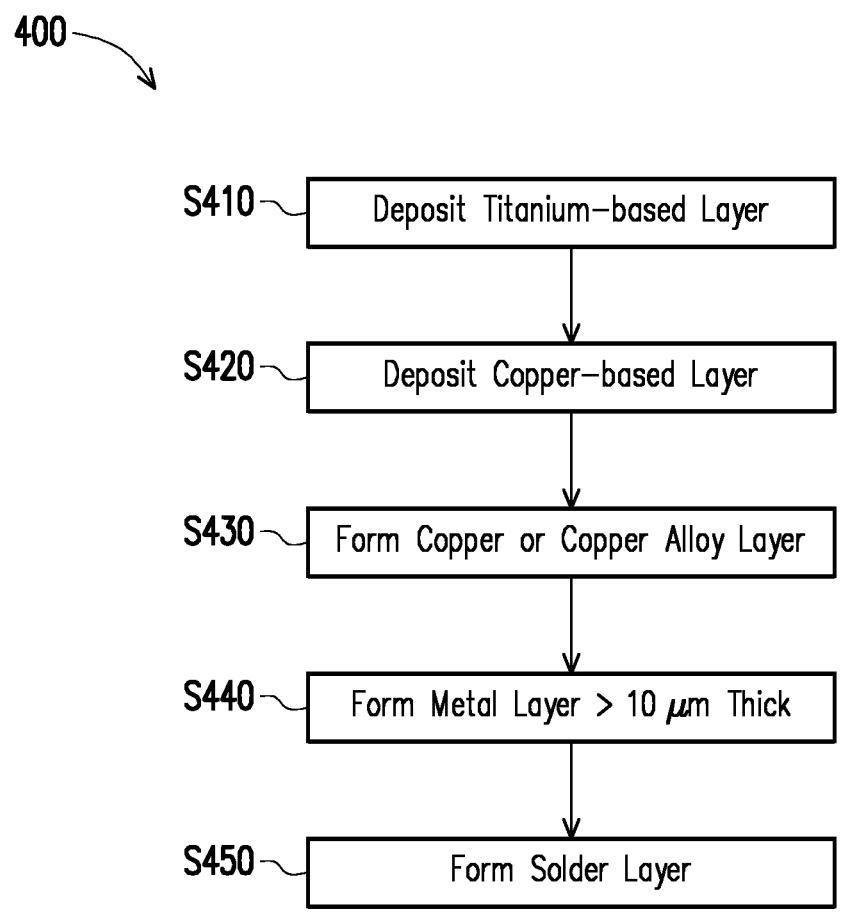
FIG. 17 is a flowchart illustrating a method of fabricating a semiconductor device according to an embodiment of the disclosure.
Figure 18:
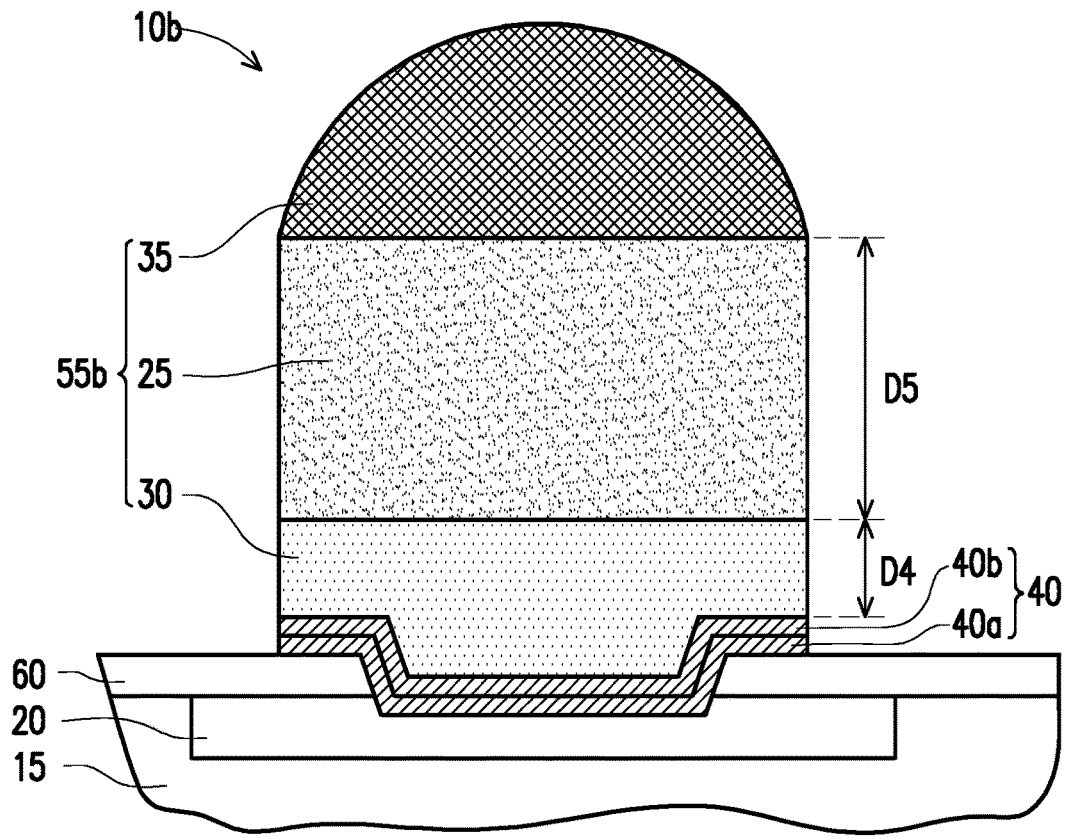
FIG. 18 is a schematic view of a bump structure according to an embodiment of the disclosure.

FIG. 17 is a flowchart illustrating a method 400 of fabricating a semiconductor device 10b having a bump structure 55b according to another embodiment of the disclosure. The semiconductor device 10b formed according to the method 400 of FIG. 17 is illustrated in FIG. 18. FIG. 18 is a schematic view of a semiconductor device 10b having at least one bump structure 55b according to another embodiment of the disclosure. A titanium-based layer 40a is formed over the substrate 15 in operation S410. A copper-based layer 40b is deposited over the titanium-based layer 40a in operation S420. Thus, an under bump metallization 40 is formed including a plurality of layers 40a, 40b. In some embodiments, the titanium-based layer 40a and copper-based layer 40b are deposited by sputtering. In some embodiments, the thickness of the titanium-based layer 40a is about 5 nm to about 100 nm. In other embodiments, the thickness of the titanium-based layer 40a is about 20 nm to about 70 nm. In some embodiments, the thickness of the copper-based layer 40b is about 5 nm to about 500 nm. In other embodiments, the thickness of the copper-based layer 40b is about 10 nm to about 100 nm. In other embodiments, the thickness of the copper-based layer 40b is about 20 nm to about 70 nm. In an embodiment, the titanium-based layer is a sputter-deposited layer of Ti or TiW having a thickness ranging from about 20 nm to about 70 nm.

After forming the under bump metallization 40, a copper or copper alloy layer 30 is formed over the under bump metallization 40 in operation S430. In some embodiments, the copper or copper alloy layer is formed by electro or electroless plating to a height D4 of about 5 μm to about 10 μm as measured from the upper surface of the under bump metallization 40. A metal layer having a lower solderability than copper or a copper alloy to a solder alloy having a height D5 of greater than 10 μm is formed over the copper or copper alloy layer 30 in operation S440 to form a pillar 25. In some embodiments, the pillar 25 has a height up to 30 μm. In some embodiments, the pillar 25 is a nickel-based material, formed by a suitable metal deposition operation previously disclosed herein. A solder layer 35 is subsequently formed on the pillar 25 in operation S450, thereby forming the bump structure 55b.

In some embodiments, the titanium-based layer 40a and copper-based layer 40b cover the upper surface of the bonding pads 20 and substrate 15, and then the titanium-based layer 40a and the copper-based layer 40b are patterned using suitable photolithography and etching operations to form a plurality of under bump metallizations 40 over the bonding pads 20. Then the insulating layer 60 is formed surrounding the under bump metallization 40. In some embodiments, the under bump metallizations 40 are arranged in a row-column arrangement having a pitch of about 15 μm to about 60 μm.

In some embodiments, the forming the metal layer having a lower solderability than copper or a copper alloy to a solder alloy 25 includes: forming a photoresist layer over the substrate 15 and the plurality of under bump metallizations, photolithographically patterning the photoresist layer to form a plurality of openings exposing the plurality of under bump metallizations, depositing the metal in the plurality of openings, depositing a solder layer over the metal in the plurality of openings, and removing the photoresist layer, similar to the operations disclosed in FIGS. 5-10.

It is understood that the device shown in FIG. 18 undergoes further semiconductor processes to form various features such as external contacts, dielectric layers, integration into modules, etc.

Figure 19:
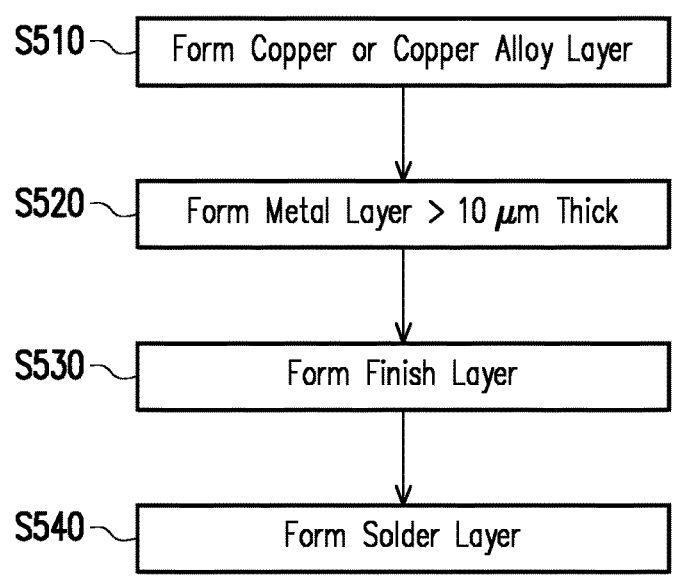
FIG. 19 is a flowchart illustrating a method of fabricating a semiconductor device according to an embodiment of the disclosure.
Figure 20:
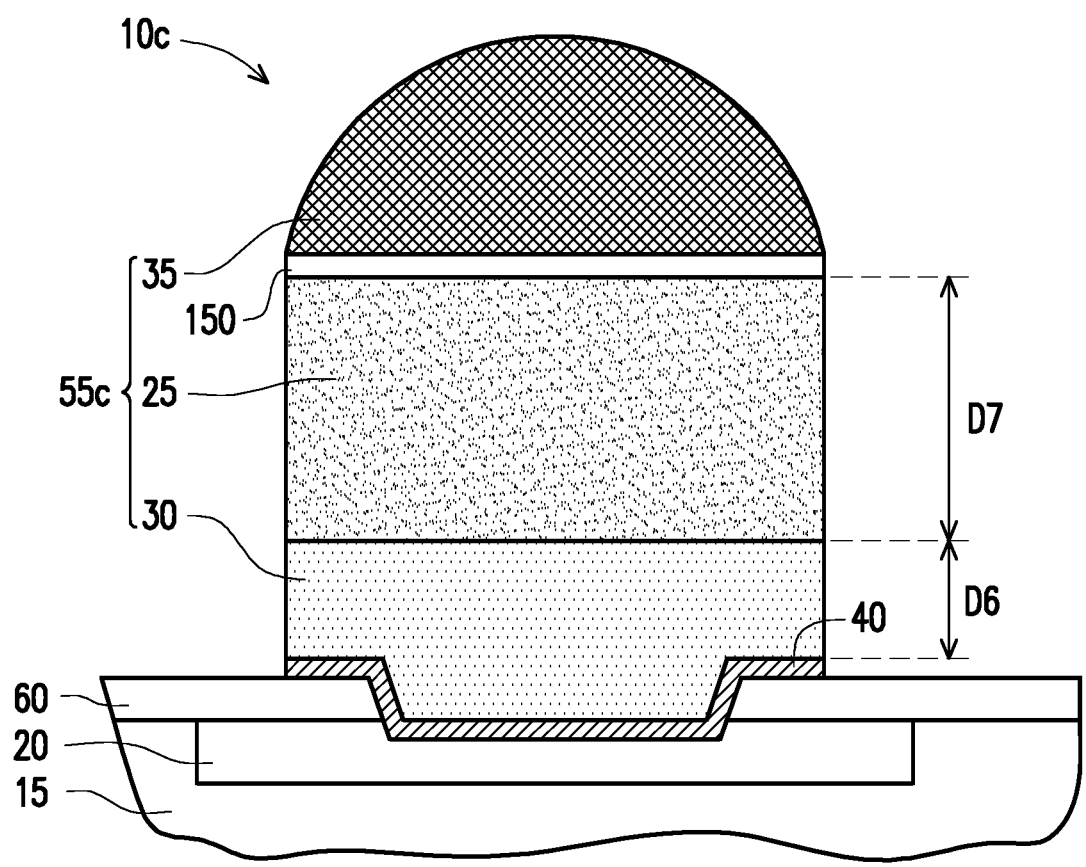
FIG. 20 is a schematic view of a bump according to an embodiment of the disclosure.

FIG. 19 is a flowchart illustrating another method 500 of fabricating a semiconductor device 10c according to another embodiment of the disclosure. The semiconductor device 10c includes a bump structure 50c including a substrate 15 and at least one bump structure 55c disposed on the substrate 15 as shown in FIG. 20. In operation S510, a copper or copper alloy layer 30 is formed over the under bump metallization 40. In some embodiments, the copper or copper alloy layer is formed to a height D6 of about 5 μm to about 10 μm as measured from the upper surface of the under bump metallization 40. A metal layer having a lower solderability than copper or a copper alloy to a solder alloy having a height D7 of greater than 10 μm is formed over the copper or copper alloy layer in operation S520 to form a pillar 25. In some embodiments, the pillar 25 has a height up to 30 μm. In some embodiments, the pillar 25 is a nickel-based material, formed by a suitable metal deposition operation previously disclosed herein. Next, a finish layer 150 is formed over the pillar 25 in operation S530. After forming the finish layer 150, a solder layer 35 is formed over the finish layer 150 in operation S540, thereby forming the bump structure 55c.

In some embodiments, the finish layer 150 is a metal layer. The finish layer 150 may be formed of nickel, although other metals may be added. In some embodiments, the finish layer 150 is formed of electroless nickel electroless palladium immersion gold (ENEPIG), which includes a nickel layer, a palladium layer on the nickel layer, and a gold layer on the palladium layer. The gold layer may be formed using immersion plating. In other embodiments, the finish layer 150 is formed of other known finish materials and methods, including, but not limited to, electroless nickel immersion gold (ENIG), direct immersion gold (DIG), or the like. In some embodiments, the finish layer is substantially copper free. As used herein, substantially copper free means that if there is any copper in the finish layer it is only present at impurity levels. Methods of forming the finish layer 150 include electroless plating, immersion, and the like. The finish layer 150 forms a large interface area with underlying pillar 25, thereby improving bonding between pillar 25 and the solder layer 35. In some embodiments, the finish layer 150 has a thickness ranging from about 5 nm to about 100 nm.

It is understood that the device shown in FIG. 20 undergoes further semiconductor processes to form various features such as external contacts, dielectric layers, integration into modules, etc.

Solder can flow quickly down a pillar, such as a copper pillar, during the bonding process while forming an intermetallic compound/alloy between the copper pillar and tin in the solder. The rapid flow down the pillar may create voids in the solder bond. The use of a metal having a lower solderability (or wettability) than copper or a copper alloy for the pillar slows down the formation of the intermetallic compound and the flow of solder down the pillar, thereby suppressing the formation of voids in the solder bond. Because solder flow down the sides of the bump structures is inhibited, the solder remains in the solder joint area during soldering operations, thereby preventing the formation of voids in the solder joints. In addition, the problems of solder overflow and the formation of short circuits because the solder flow down the sides of the bump structures is inhibited by the metal having a lower solderability (or wettability) than copper or a copper alloy. Devices and methods according to the present disclosure improve reliability of semiconductor device, particularly as the size and pitch of bump structures decreases.

It will be understood that not all advantages have been necessarily discussed herein, no particular advantage is required for all embodiments or examples, and other embodiments or examples may offer different advantages.

An embodiment of the present disclosure is a semiconductor device including a substrate and at least one bump structure disposed over the substrate. The at least one bump structure includes a pillar formed of a metal having a lower solderability than copper or a copper alloy to a solder alloy disposed over the substrate, and a solder alloy formed directly over and in contact with an upper surface of the metal having the lower solderability than copper or a copper alloy. The pillar has a height of greater than 10 μm. In an embodiment, the semiconductor device includes a copper or copper alloy layer between the pillar and the substrate, wherein the height of the pillar is greater than a height of the copper or copper alloy layer. In an embodiment, the copper or copper alloy layer has a height of 5 μm to 10 μm. In an embodiment, a ratio of the height of the pillar to the height of the copper or copper alloy ranges from 6/1 to 1.5/1. In an embodiment, the ratio of the height of the pillar to the height or copper or copper alloy ranges from 5/1 to 3/1. In an embodiment, the pillar is formed mainly of a metal selected from the group consisting of aluminum, chromium, iron, manganese, magnesium, molybdenum, nickel, niobium, tantalum, titanium, tungsten, zinc, and alloys thereof. In an embodiment, the height of the pillar ranges from greater than 10 μm to 30 μm. In an embodiment, the pillar has a diameter ranging from 5 μm to 40 μm. In an embodiment, the pillar has a diameter ranging from 20 μm to 25 μm. In an embodiment, the semiconductor device includes an under bump metallization disposed between the substrate and the bump structure. In an embodiment, the plurality of bump structures are arranged in a row-column arrangement having a pitch ranging from 15 μm to 60 μm.

Another embodiment of the disclosure is a semiconductor device, including a first substrate including a first circuitry and a second substrate. The first substrate is connected to the second substrate through a connection comprising a solder layer disposed between a first pillar and a second pillar. The first pillar is formed of a nickel-based material having a height of greater than 10 μm. In an embodiment, the semiconductor device includes a copper or copper alloy layer disposed between the first pillar and the substrate, wherein the height of the first pillar is greater than a height of the copper or copper alloy layer. In an embodiment, the copper or copper alloy layer has a height of 5 μm to 10 μm. In an embodiment, a ratio of the height of the first pillar to the height of the copper or copper alloy layer ranges from 6/1 to 1.5/1. In an embodiment, the first pillar or the second pillar has a diameter ranging from 5 μm to 40 μm. In an embodiment, the semiconductor device includes a substantially copper free finish layer between the first pillar and the solder layer.

Another embodiment of the disclosure is a semiconductor device having a bump structure, including a substrate and at least one bump structure disposed over the substrate. The at least one bump structure includes a pillar formed of a nickel-based material having a height of greater than 10 μm, and a solder alloy formed directly over and in contact with an upper surface of the pillar. In an embodiment, the semiconductor device includes a copper or copper alloy layer between the pillar and the substrate, wherein a ratio of the height of the pillar to a height of the copper or copper alloy layer ranges from 6/1 to 1.5/1. In an embodiment, a height of the pillar ranges from greater than 10 μm to 30 μm.

Another embodiment of the disclosure is a method of fabricating a semiconductor device, including forming a photoresist layer over a substrate, and patterning the photoresist layer to form a plurality of openings exposing the substrate. A metal having a lower solderability than copper or a copper alloy material is deposited in the plurality of openings. A solder layer is formed over the metal having a lower solderability than copper or a copper alloy material in the plurality of openings, and the photoresist layer is removed. The solder layer is in direct contact with the metal having a lower solderability than copper or a copper alloy material. In an embodiment, the method includes depositing a copper or copper alloy material in the plurality of openings before depositing the metal layer having a lower solderability than copper or a copper alloy in the plurality of openings, wherein a height of the metal having a lower solderability than copper or a copper alloy material is greater than a height of the copper or copper alloy material. In an embodiment, the method includes forming a titanium-based layer between the substrate and the metal having a lower solderability than copper or a copper alloy material. In an embodiment, the titanium-based layer is formed by sputtering. In an embodiment, a sputter-deposited copper-based layer is formed over the titanium-based layer. In an embodiment, the method includes electro or electroless plating the copper or copper alloy material on the sputter-deposited copper-based layer. In an embodiment, the metal having a lower solderability than copper or a copper alloy to a solder alloy has a height of greater than 10 µm to 30 µm. In an embodiment, the metal having a lower solderability than copper or a copper alloy is deposited in the plurality of openings by electro or electroless plating. In an embodiment, the method includes: forming a titanium-based layer over the substrate, forming a copper-based layer over the titanium-based layer, and etching the titanium-based layer and the copper-based layer to form a plurality of under bump metallizations arranged in a row-column arrangement having a pitch ranging from 15 µm to 60 µm.

Another embodiment of the disclosure is a method of fabricating a semiconductor device, including patterning a photoresist layer disposed over a first substrate to form openings exposing a portion of the first substrate. A metal layer having a lower solderability than copper or a copper alloy to a solder alloy is deposited in the openings. The metal layer having a lower solderability than copper or a copper alloy has a height of greater than 10 µm. A solder layer is formed over the metal layer having a lower solderability than copper or a copper alloy. The photoresist layer is removed, thereby forming a plurality of first bump structures on the first substrate. The first substrate and a second substrate having a plurality of second bump structures are arranged so that the first bump structures and the second bump structures face each other and are aligned with each other. The first bump structures and the second bump structures are brought into contact with each other, and energy is applied to the first and second bump structures so that solder on the bump structures flows and the first bump structure and the second bump structure fuse together. In an embodiment, the method includes depositing a copper or copper alloy layer in the openings, wherein the height of the metal layer having a lower solderability than copper or a copper alloy is greater than a height of the copper or copper alloy layer. In an embodiment, the energy is thermal energy, ultrasonic energy, or a combination of thermal energy and ultrasonic energy. In an embodiment, the first substrate is bonded to the second substrate through a pillar/solder/pillar connection after the first and second bump structures fuse together. In an embodiment, the metal having a lower solderability than copper or a copper alloy is formed mainly of a metal elected from the group consisting of aluminum, chromium, iron, manganese, magnesium, molybdenum, nickel, niobium, tantalum, titanium, tungsten, zinc, and alloys thereof. In an embodiment, the method includes forming a Cu layer having a thickness of about 5 µm to 10 µm between the metal layer having a lower solderability than copper or a copper alloy and the first substrate.

Another embodiment of the disclosure is a method of fabricating a semiconductor device, including depositing a titanium-based layer on a substrate. A nickel-based layer having a height of greater than 10 µm is deposited over the titanium-based layer. A solder layer is formed directly on and in contact with an upper surface of the nickel-based layer. In an embodiment, the titanium-based layer is deposited by sputtering. In an embodiment, the method includes sputter-depositing a copper-based layer over the titanium-based layer. In an embodiment, the method includes electro or electroless plating a copper or copper alloy layer on the sputter-deposited copper-based layer. In an embodiment, a ratio of the height of the nickel-based layer to a height of the copper or copper alloy layer ranges from 6/1 to 1.5/1.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate; and
   at least one bump structure disposed over the substrate, wherein the at least one bump structure comprises:
      a pillar disposed over the substrate;
      a solder alloy formed over the pillar; and
      a copper or copper alloy layer between the pillar and the substrate, wherein the height of the pillar is greater than a height of the copper or copper alloy layer,
      wherein the pillar has a height of greater than 10 µm,
      the pillar is formed mainly of a metal having a lower solderability than copper or a copper alloy to the solder alloy,
      the solder alloy is formed directly over and in direct contact with an upper surface of the metal having the lower solderability than copper or a copper alloy, and
      a ratio of the height of the pillar to the height of the copper or copper alloy layer ranges from 6/1 to 1.5/1.

2. The semiconductor device of claim 1, wherein the copper or copper alloy layer has a height of 5 µm to 10 µm.

3. The semiconductor device of claim 1, wherein the ratio of the height of the pillar to the height or copper or copper alloy ranges from 5/1 to 3/1.

4. The semiconductor device of claim 1, wherein the pillar is formed mainly of a metal selected from the group consisting of aluminum, chromium, iron, manganese, magnesium, molybdenum, nickel, niobium, tantalum, titanium, tungsten, zinc, and alloys thereof.

5. The semiconductor device of claim 1, wherein the height of the pillar ranges from greater than 10 µm to 30 µm.

6. The semiconductor device of claim 1, wherein the pillar has a diameter ranging from 5 µm to 40 µm.

7. The semiconductor device of claim 6, wherein the pillar has a diameter ranging from 20 µm to 25 µm.

8. The semiconductor device of claim 1, further comprising an under bump metallization disposed between the substrate and the bump structure.

9. The semiconductor device of claim 1, wherein the plurality of bump structures are arranged in a row-column arrangement having a pitch ranging from 15 µm to 60 µm.

10. The semiconductor device of claim 1, wherein the pillar is formed mainly of a metal selected from the group consisting of aluminum, nickel, tantalum, tungsten, and alloys thereof.

11. A semiconductor device, comprising:
a first substrate including a first circuitry; and
a second substrate;
wherein the first substrate is connected to the second substrate through a connection comprising a solder layer disposed between a first pillar and a second pillar,
wherein the first pillar is formed of a nickel-based material having a height of greater than 10 µm,
wherein the solder alloy is formed directly over and in direct contact with an upper surface of the first pillar,
wherein a copper or copper alloy layer is disposed between the first pillar and the first substrate,
wherein the copper or copper alloy layer has a height of 5 µm to 10 µm, and
wherein a ratio of the height of the first pillar to the height of the copper or copper alloy layer ranges from 6/1 to 1.5/1.

12. The semiconductor device of claim 11, wherein the first pillar or the second pillar has a diameter ranging from 5 µm to 40 µm.

13. The semiconductor device of claim 11, further comprising a substantially copper free finish layer between the first pillar and the solder layer.

14. The semiconductor device of claim 11, wherein the ratio of the height of the pillar to the height or copper or copper alloy ranges from 5/1 to 3/1.

15. A semiconductor device having a bump structure, comprising:
a substrate; and
at least one bump structure disposed over the substrate,
wherein the at least one bump structure comprises:
a pillar formed of a nickel-based material having a height of greater than 10 µm;
a solder alloy formed directly over and in direct contact with an upper surface of the pillar; and
a copper or copper alloy layer between the pillar and the substrate,
wherein a ratio of the height of the pillar to a height of the copper or copper alloy layer ranges from 6/1 to 1.5/1.

16. The semiconductor device of claim 15, wherein a height of the pillar ranges from greater than 10 µm to 30 µm.

17. The semiconductor device of claim 15, wherein the ratio of the height of the pillar to the height or copper or copper alloy ranges from 5/1 to 3/1.

18. The semiconductor device of claim 15, wherein the copper or copper alloy layer has a height of 5 µm to 10 µm.

19. The semiconductor device of claim 15, wherein the pillar has a diameter ranging from 5 µm to 40 µm.

20. The semiconductor device of claim 15, wherein the pillar has a diameter ranging from 20 µm to 25 µm.

* * * * *